(12) United States Patent
Lin (10) Patent No.: US 7,943,513 B2
(45) Date of Patent: May 17, 2011

(54) CONDUCTIVE THROUGH CONNECTION AND FORMING METHOD THEREOF

(75) Inventor: Shian-Jyh Lin, Yonghe (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 12/506,394

(22) Filed: Jul. 21, 2009

(65) Prior Publication Data
US 2010/0258917 A1    Oct. 14, 2010

(30) Foreign Application Priority Data

Apr. 10, 2009    (TW) .............................. 98112115 A (51) Int. Cl.
*H01L 21/44*    (2006.01)

(52) U.S. Cl. ......... 438/667; 438/928; 257/621; 257/622

(58) Field of Classification Search .................. 257/621, 257/622; 438/928, 666, 667
See application file for complete search history.

(56) References Cited

U.S. PATENT DOCUMENTS

| | | | |
|---|---|---|---|
| 6,822,316 B1 * | 11/2004 | Hsuan | ............................ 257/621 |
| 7,232,754 B2 * | 6/2007 | Kirby et al. | .................... 438/667 |
| 7,528,491 B2 | 5/2009 | Kirby et al. | |
| 2006/0289968 A1 * | 12/2006 | Sulfridge | ....................... 257/621 |
| 2007/0132085 A1 | 6/2007 | Shibata et al. | |

* cited by examiner

*Primary Examiner* — Leonardo Andújar
(74) *Attorney, Agent, or Firm* — Volpe and Koenig, P.C.

(57) ABSTRACT

A conductive through connection having a body layer and a metal layer is disposed on a semiconductor device, which the metal layer is on a top of body layer and includes a conductive body configured to penetrate the body layer and the metal layer. The width/diameter of one end of the conductive body is larger than that of another end thereof. The shape of these two ends of the body layer can be rectangular or circular.

17 Claims, 12 Drawing Sheets

CONDUCTIVE THROUGH CONNECTION
AND FORMING METHOD THEREOF

FIELD OF THE INVENTION

The present invention relates to a conductive through connection, particularly to a conductive through connection formed in the through-substrate via (TSV).

BACKGROUND OF THE INVENTION

Lots of electronic products are oriented to be portable, multi-functional and slim with the development of electronic technology, but it is also referred to that the functions and the included circuit devices collocated in electronic products are increased, more complicated and more elegant. However, even the lithographic processes used in the formation of integrated circuit (IC) with very-large-scale-integration (VLSI) achieve to nano-level limits of 45 nm, 32 nm or less, vigorous development for three-dimensional chip stacking technology is promoted in order to integrate more abundant amount of ICs within the limited chip area.

Figure 1:
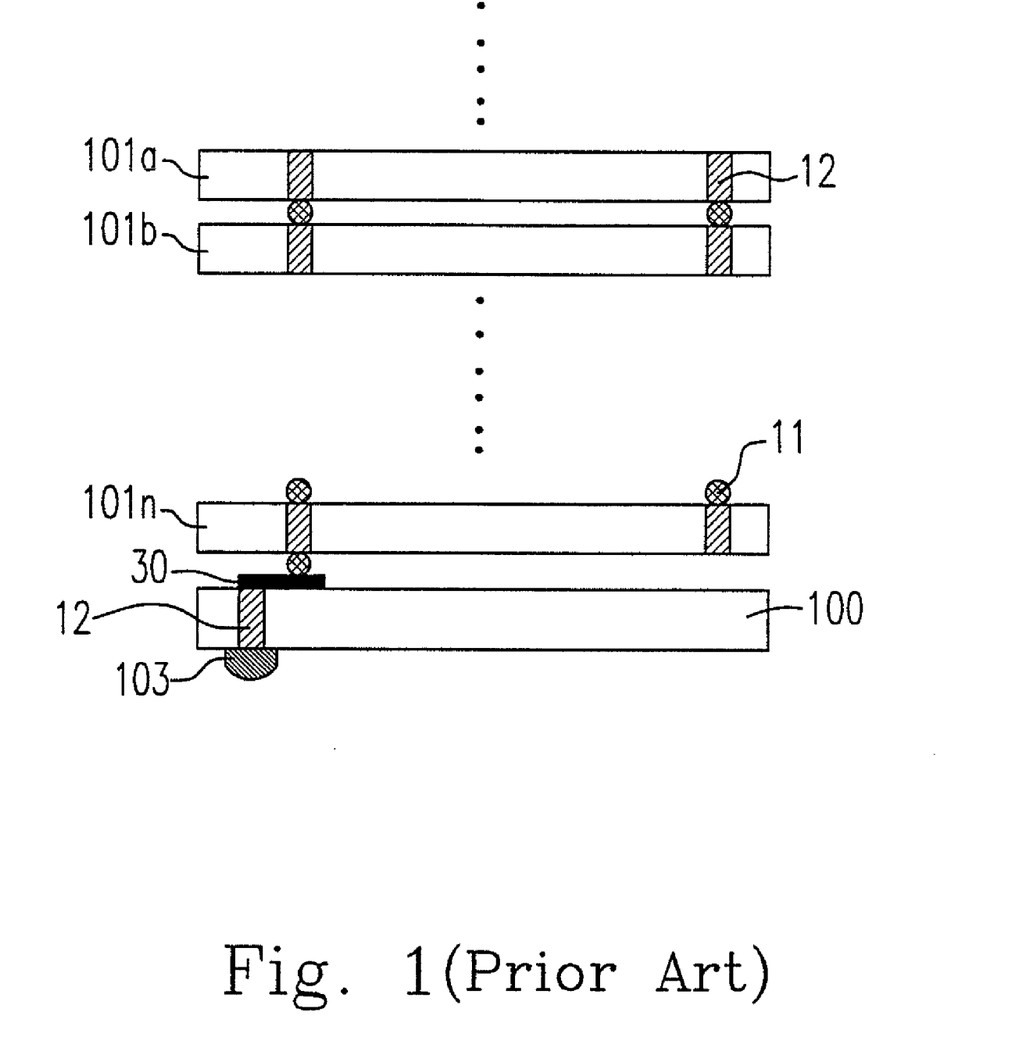
FIG. 1 illustrates the diagram showing the stacking technology for the three-dimensional chip in the prior art.

Please refer to FIG. 1, which illustrates a diagram showing the stacking technology for the three dimensional chip in the prior art. In FIG. 1, a plurality of core chips 101a, 101b, ... 101n are electrically connected with each other by the contact portions 11 and the through connection elements 12 (i.e. electrodes). Each of core chips 101a, 101b, ... 101n further can be electrically connected to the circuit chip 100 by the metal connection 30, so as to transmit or receive the control signals. The circuit chip 100 (i.e. interposer) further is electrically connected to other external circuit by the external terminal 103. The plurality of core chips 101a, 10b, ... 101n in FIG. 1 are vertically stacked with the contact portions 11, which are electrically connected to each of core chips 101a, 101b, ... 101n by the through connection elements 12. The above-mentioned illustration is the stacked three-dimensional chip in the prior art, and information regarding the chip stacking technology in the prior art can be referred to U.S. Patent Application No. 2007/0132085 A1.

Nowadays, art of semiconductor is oriented towards minimization. However, defects of the aforementioned stacking technology would be generated as illustrated follows. The dimensions of the contact portions 11 and the through connection elements 12 (shown in FIG. 1) will be minimized to nano size with the minimization of the critical dimension. If 1) the alignment within each of core chips 101a, 101b, ... 101n is shifted; 2) the positions of the through connection elements 12 generate errors in the chip manufacturing processes; or 3) the positions of the contact portions 11 generate errors in the stacking process, the contact portions 11 will not be precisely and electrically connected to the through connection elements 12, so that the stacked three-dimensional chips cannot normally work and be an imperfection.

It is therefore attempted by the applicant to deal with the above situation encountered in the prior art.

SUMMARY OF THE INVENTION

In view of the defects existed in the prior art, the conductive through connection of one embodiment of the present invention is manufactured by forming a plurality of bottle-shaped through substrate via (TSV) structures in such as wafer, chip or die of the semiconductor device and then filling the TSV with a conductive material. Taking chips as an example, when a plurality of chips are stacked on top of one another, each of the chips can be electrically connected to one another to transmit electronic signals by electrically connected TSV. Since the width/diameter of one end of the conductive through connection in one embodiment of the present invention is smaller to the other end thereof such that a larger space is available for tolerance occurred when the chips are stacked. Therefore, the problem for difficult to alignment in stacking the microchips can be solved. Particularly, the problem for the demand of precise alignment in stacking the nanochips can be overcome. It is worthy to note that the conductive through connection raised in the present invention can be disposed by passing through a bond pad.

In accordance with the first aspect of the present invention, a method for forming a conductive connection in a semiconductor device is provided. The semiconductor device includes an element layer and a metal layer. The method includes steps of: (a) forming a first groove extended from the metal layer into the element layer, wherein the first groove has a first dimension and a first sidewall having a metal layer portion sidewall and an element layer portion sidewall; (b) forming a second groove connected beneath the first groove, wherein the second groove has a second dimension and a second sidewall, and the second dimension is larger than the first dimension; (c) forming a dielectric layer on the element layer portion sidewall and the second sidewall; (d) filling the first groove and the second groove with a conductive material; and (e) removing a part of the element layer to reveal the conductive material.

Preferably, each of the first and the second dimensions is a width or a diameter, and the step (a) further includes a step (a0) of forming a photomask layer on the metal layer and a step (a01) of removing the photomask layer.

Preferably, the step (a) further includes a step (a1) of forming a protective layer on the first sidewall.

Preferably, the first groove further has a bottom surface, and the step (a1) further includes a step (a11) of etching the bottom surface by one of a wet etching and a chemical dry etching.

Preferably, the step (b) further includes a step (b1) of removing the protective layer after the second groove is formed.

Preferably, the protective layer is an aluminum oxide layer or an insulating dielectric layer, which is made of silicon oxide ($SiO_2$), a silicon nitride ($Si_3N_4$) and a combination thereof (i.e. $SiO_2/Si_3N_4$).

Preferably, the step (c) further includes a step (c1) of forming a seed layer on the metal layer portion sidewall and the dielectric layer, and the seed layer is a tantalum nitride (TaN) layer or a titanium nitride (TiN) layer.

Preferably, the first groove is formed by an anisotrophic etching, and the second groove is formed by an isotrophic etching.

Preferably, the step (d) is performed by a treatment being one selected from a group consisting of a physical vapor deposition, a chemical vapor deposition and an electroplating.

Preferably, the step (d) further includes the steps of: (d1) removing a part of the conductive material to form a third groove; and (d2) filling the third groove with a second conductive material. The second conductive material is tungsten or aluminum-copper (Al—Cu) alloy.

Preferably, the step (d2) further includes a step (d3) of removing the metal layer to form a bond pad, and the step (d3) is performed by a plurality of steps of an exposing step, a developing step and an etching step.

Preferably, the step (e) is performed by a polishing process including a chemical mechanical planarization (CMP), and the conductive material is one selected from a group consisting of a tungsten, a poly-silicon and a copper.

Preferably, the semiconductor device further includes a second dielectric layer stacked between the element layer and the metal layer, the second dielectric layer and the element layer are fabricated as a body layer, and the conductive connection is a conductive through connection.

Preferably, the metal layer is one of a bond pod and a metal circuit.

In accordance with the second aspect of the present invention, a method for forming a conductive connection in a semiconductor device is provided. The semiconductor device has a body layer and a metal layer, and the method includes steps of: (a) forming a space in the semiconductor device; and (b) filling the space with a conductive material to form two ends in the semiconductor device. The two ends has dimensions different from each other.

Preferably, the semiconductor device has a body layer and a metal layer. The space passes through the body layer and the metal layer, and has a peripheral sidewall having a body layer portion and a metal layer portion. The two ends respectively locate in the body layer and the metal layer, and the conductive connection is a conductive through connection. The method further includes a step (a1) of forming a dielectric layer on the body layer portion of the peripheral sidewall.

In accordance with the second aspect of the present invention, a semiconductor device is provided. The semiconductor device includes a conductive connection having a first end with a first dimension and a second end with a second dimension. The first dimension is different from the second dimension.

Preferably, the semiconductor device is a wafer, a chip or a die, and the conductive connection is a conductive through connection.

The above objectives and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following Embodiments. It is to be noted that the following descriptions of preferred Embodiments of this invention are presented herein for purpose of illustration and description only; it is not intended to be exhaustive or to be limited to the precise form disclosed.

In FIG. 2(a) to 2(l), the first preferred embodiment for the forming method of the conductive through connection in the present invention is illustrated as follows.

Figure 2A:
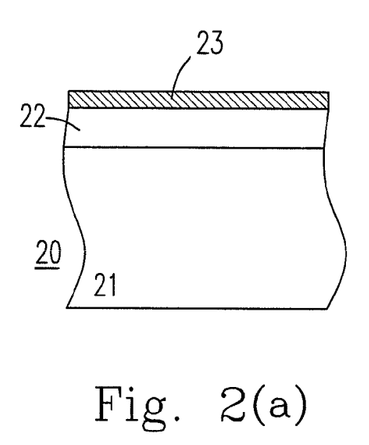
FIGS. 2(a) to 2(l) illustrate the diagrams showing the method for forming conductive through connection in accordance with a first preferred embodiment of the present invention.

Please refer to FIG. 2(a), first, a semiconductor device is provided, which is a wafer, a chip or a die. The wafer 20 is taken as the example to be the semiconductor device in this preferred embodiment, and this wafer 20 can be logical chips, memory chips or analog chips, such as Flash chips and Dynamic Random Access Memory (DRAM) chips, etc. The wafer 20 includes the element layer 21, the dielectric layer 22 and the metal layer 23, which are sequentially stacked from down to up. The element layer 21 and the dielectric layer 22 are fabricated as the body layer, wherein the material of element layer 21 mainly is the semiconductor material (such as silicon). The element layer 21 is integrated with integrated circuits (ICs), including electronic components (ex. active/passive components, memory cells, logic cells, cell arrays and multiple internal connection structures, etc.) necessary in the ICs. The metal layer 23 is the bond pad disposed on the surface of wafer 20 or other metal circuit disposed on the surface of wafer for conductive connection. The dielectric layer 22 is configured between the element layer 21 and the metal layer 23.

Figure 2B:
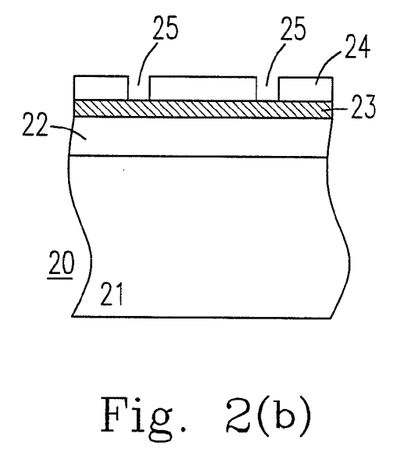

Next, please refer to FIG. 2(b), a photomask layer 24 is covered on the metal layer 23, and the photomask layer 24 can be the positive/negative photo resistance, other useful photo-resistant materials in the semiconductor manufacturing processes or the pre-manufactured hard mask. As showing in FIG. 2(b), a plurality of groove patterns 25 are laid out on the photomask layer 24.

Figure 2C:
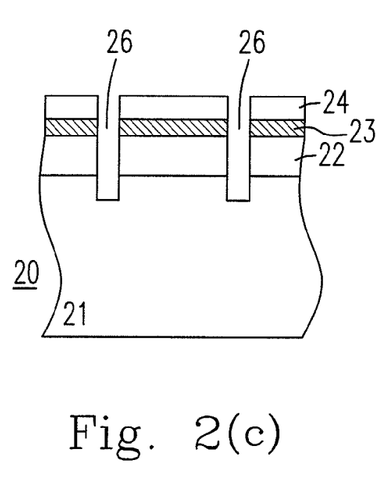
Figure 2D:
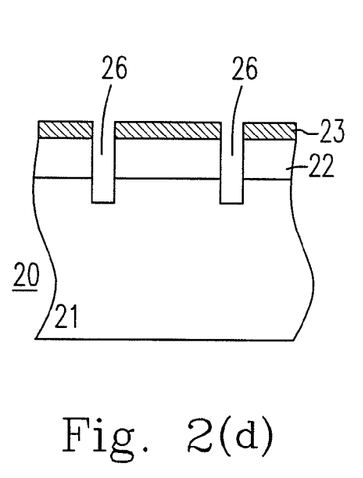

Please continuously refer to FIG. 2(c), the groove patterns 25 on the photomask layer 24 are transferred (patterned) on the photomask layer 24. In this preferred embodiment, the metal layer 23, the dielectric layer 22 and the element layer 21 which are not covered with the photomask layer 24 are removed by anisotrophic etching, so as to form a first groove 26 on the wafer 20. As shown in FIG. 2(c), the first groove 26 shows the result of the dry etching that extends into the element layer 21 but does not penetrate the element layer 21 or the wafer 20. After etching, the photomask layer 24 is removed from the metal layer 23 (shown in FIG. 2(d)).

Figure 2E:
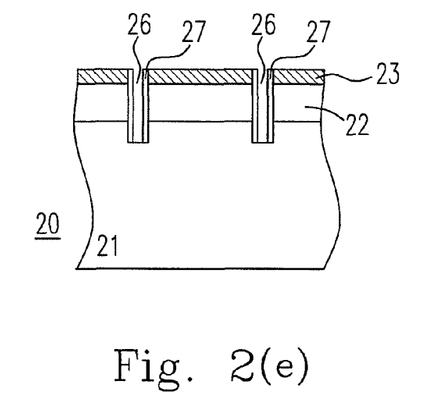
Figure 2F:
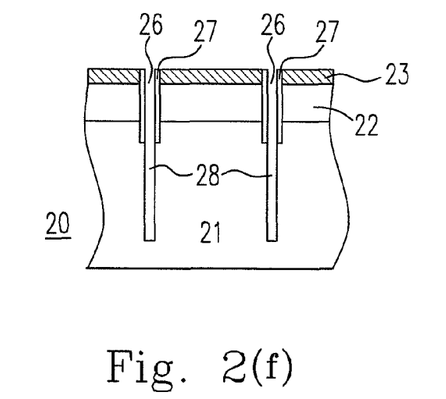
Figure 2G:
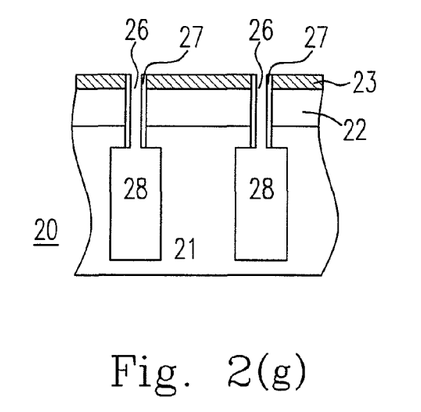

Please continuously refer to FIG. 2(e), a protective layer 27 is formed on the sidewall of the first groove 26. In this preferred embodiment, an aluminum oxide ($Al_2O_3$) layer or an insulating dielectric layer, such as silicon dioxide ($SiO_2$), silicon nitride ($Si_3N_4$) or $SiO_2/Si_3N_4$ complex layer, is deposited on the sidewall of the first groove 26 to be the protective layer 27 by atomic layer deposition (ALD) or chemical vapor deposition (CVD) process. Please continuously refer to FIG. 2(f), the element layer 21 uncovered with the protective layer 27 in the bottom of the first groove 26 is removed by wet etching or chemical dry etching, so that a second groove 28 is formed beneath the bottom of the first groove 26. Please continuously refer to FIG. 2(g), the sidewall of the second groove 28 and the bottom of the element layer 21 are removed by isotrophic etching so as to enlarge the second groove 28, and the width/diameter of the second groove 28 is larger than that of the first groove 26. Preferably, the first groove 26 or the second groove 28 can be a rectangular shape and a cylindrical shape. However, the first groove 26 and the second groove 28 are not therefore limited in the implemented mode. The drawings shown in this preferred embodiment are only the cylindrical shape.

Figure 2H:
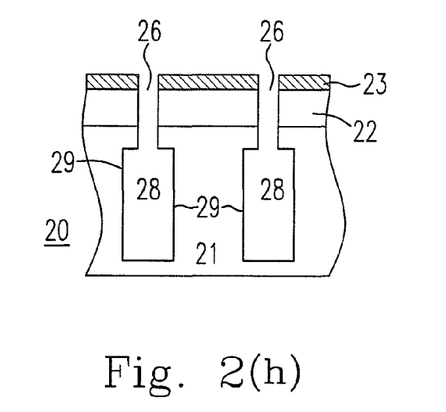

Please continuously refer to FIG. 2(h), the protective layer 27 is removed from the sidewall of the first groove 26 to form the channel 29 after the second groove 28 is formed. However, at present, this channel 29 has not been passed through the wafer 20. This channel 29 mainly includes two parts, the first groove 26 and the second groove 28. At this moment, a bottle-shaped channel 29 is formed in the wafer 20. It should be noted that the formation of the first groove 26, the second groove 28 or the channel 29 is not limited in the above-mentioned method. Other method for the groove- or the channel-formation useful in the semiconductor industry can be applied in the present application to form the bottle-shaped channel 29.

Figure 2I:
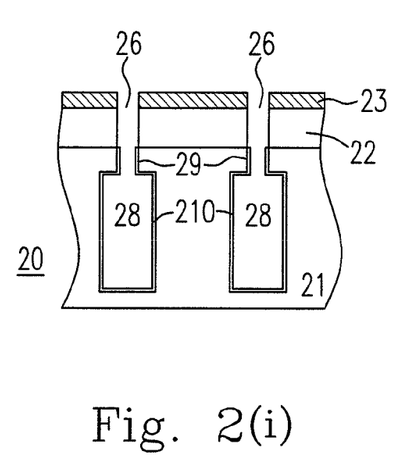

Please continuously refer to FIG. 2(i), the second dielectric layer 210 is formed on the surfaces of the first and the second grooves 26, 28. In this preferred embodiment, physical vapor deposition (PVD), CVD, ALD or other deposition processes can be selected to deposit an oxide layer or other dielectric material on the surfaces of the first and the second grooves 26, 28 in the element layer 21 to be the second dielectric layer 210.

Figure 2J:
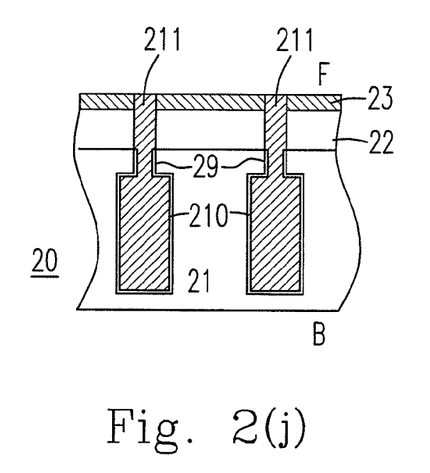

Please continuously refer to FIG. 2(j), the conductive material 211 is filled in the channel 29 including the first and the second grooves 26, 28. In this preferred embodiment, PVD or CVD process can be selected, and the materials (such as tungsten (W), poly-silicon, and so on) can be filled in the channel 29 for one or more times. Basically, the filled conductive material 211 is not limited in the above-mentioned material. The adequate conductive material 211 also is adopted with the progress of the semiconductor manufacturing processes. Other adequate conductive materials in the present manufacturing processes or in the future can be selected to fill in the channel 29 in the present invention.

Figure 2K:
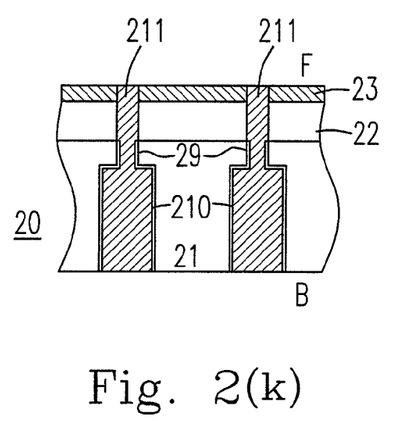
Figure 2L:
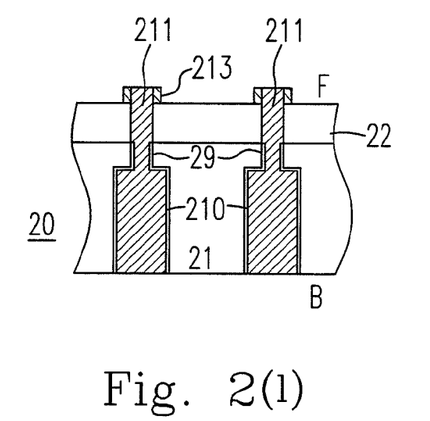

Please continuously refer to FIG. 2(k), the silicon material or silicon substrate of the partial element layer 21 (i.e. the back side B of the wafer 20) is removed by chemical mechanical planarization (CMP) or other polishing process until revealing the conductive material 211 in the second groove 28. As shown in FIG. 2(k), the channel 29 has passed through the wafer 20 to be the through substrate via (TSV), and the conductive material 211 filled in the channel 29 forms the conductive through connection of the present invention. Please continuously refer to FIG. 2(l), the metal layer 23 then is exposed and developed to form the bond pad 213.

It should be noted that, in the above-mentioned first preferred embodiment, the deep etching directly on the first groove 26 can be selected to form a groove having a depth similar with the total depth of the first groove 26 plus the second groove 28. Next, the protective layer 27 is formed on the sidewall of the first groove 26 in the metal layer 23 portion and the dielectric layer 22 portion. Next, the lower portion of the first groove 26 which is not covered with the protective layer 27 is isotrophically enlarged to form the second groove 28.

In FIGS. 3(a) to 3(d), the second preferred embodiment for the forming method of the conductive through connection in the present invention is illustrated as follows.

Figure 3A:
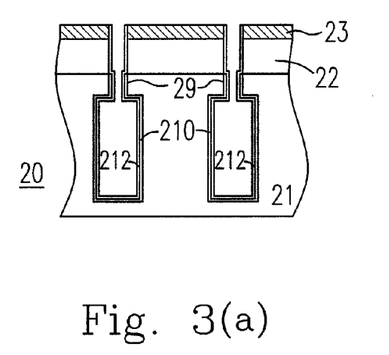
FIGS. 3(a) to 3(d) illustrate the diagrams showing the method for forming conductive through connection in accordance with a second preferred embodiment of the present invention.
Figure 3B:
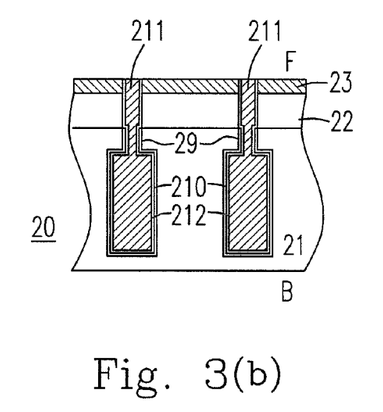
Figure 3C:
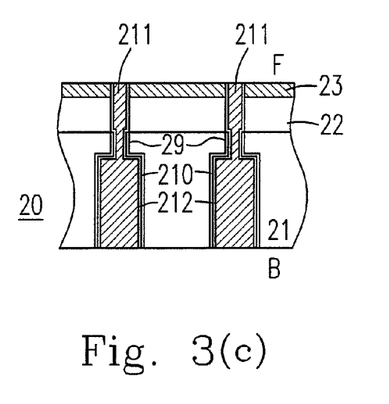
Figure 3D:
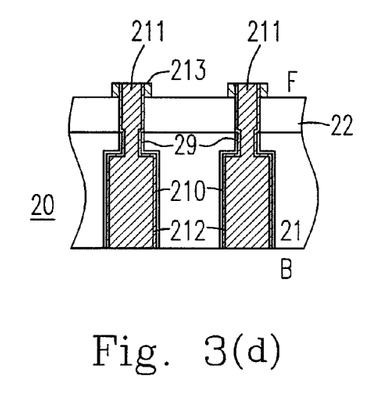

Please refer to FIG. 3(a) which follows the step in FIG. 2(i), since the conductive material 211 filled in the channel 29 is not limited in tungsten, poly-silicon, and so on, copper (Cu) also can be filled therein. However, the copper seed layer 212 must be formed on the surface of the first groove 26 and the second dielectric layer 210 at first. As shown in FIG. 3(a), the seed layer 212 is deposited on the sidewall of the channel 29. In this preferred embodiment, tantalum nitride (TaN) or titanium nitride (TiN) is selected to be the seed layer 212 and deposited on the surface of the channel 29. Please continuously refer to FIG. 3(b), next, PVD, CVD or other electroplating process is selected to fill in the seed layer 212 of the channel 29 with the conductive material 211 (i.e. Cu) for one or more times, and the conductive through connection filled with copper is formed in the channel 29. Please continuously refer to FIG. 3(c), next, the silicon material or the silicon substrate (i.e. the back side B of the wafer 20) is removed by CMP or other polishing processes until revealing the conductive material 211 of the second groove 28. As shown in FIG. 3(c), channel 29 has passed through the wafer 20 to be the TSV, and the conductive material 211 filled in the channel 29 forms the conductive through connection of the present invention. Please continuously refer to FIG. 3(d), the metal layer 23 then is exposed and developed to form the bond pad 213.

In FIGS. 4(a) to 4(f), the third preferred embodiment for the forming method of the conductive through connection in the present invention is illustrated as follows.

Figure 4A:
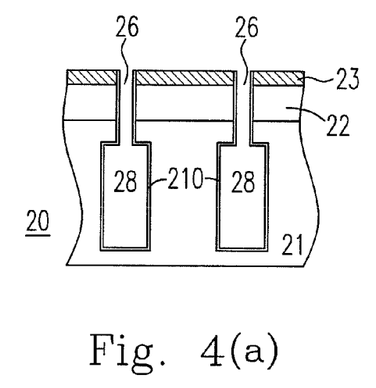
FIGS. 4(a) to 4(f) illustrate the diagrams showing the method for forming conductive through connection in accordance with a third preferred embodiment of the present invention.

Please refer to FIG. 4(a) which follows the step in FIG. 2(h), the second dielectric layer 210 is formed on the surface of the first and the second grooves 26, 28. In this preferred embodiment, PVD, CVD, ALD or other deposition processes can be selected. As shown in FIG. 4(a), an oxide layer or other dielectric material is deposited on the surface of the first and the second grooves 26, 28 in the element layer 21 portion to be the second dielectric layer 210. It should be noted that the second dielectric layer 210 shown in FIG. 4(a) is covered on all of sidewall of the first groove 26. However, the second dielectric layer 210 shown in FIG. 2(i) is covered on the surface of the first and the second grooves 26, 28 in the element layer 21 portion.

Figure 4B:
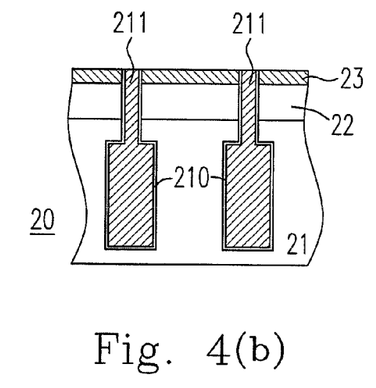

Please continuously refer to FIG. 4(b), the conductive material 211, such as tungsten, poly-silicon, and so on, is filled in the channel 29. In this preferred embodiment, PVD or CVD process is selected to fill in the channel 29 with tungsten or poly-silicon for one or more times.

Figure 4C:
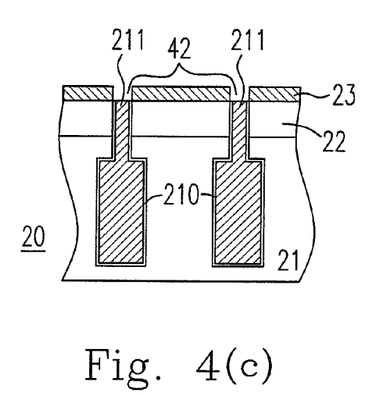
Figure 4D:
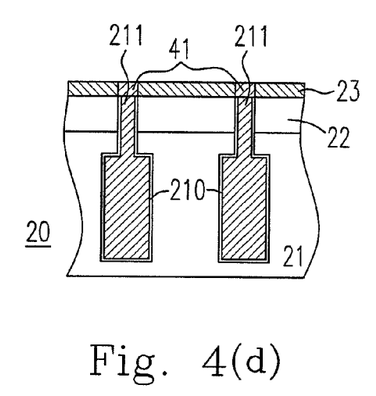

Please continuously refer to FIG. 4(c), since the conductive material 211 and the metal layer 23 are separated by a second dielectric layer 210, the conductive material 211 cannot be electrically connected to the metal layer 23. Therefore, the conductive material 211 and the second dielectric layer 210 in the metal layer 23 must be removed by back-etching to form a groove 42. As shown in FIG. 4(c), anisotrophic etching can be selected in the back-etching in this preferred embodiment. Please continuously refer to FIG. 4(d), metal is refilled in the groove 42 so that the conductive material 211 can be electrically connected to the metal layer 23. PVD, CVP or other deposition processes can be selected in back-filling in this preferred embodiment, and tungsten or aluminum-copper (Al—Cu) can be deposited in the groove 42 to form the back-filling 41. The conductive material 211 can be electrically connected to the metal layer 23 by the back-filling 41.

Figure 4E:
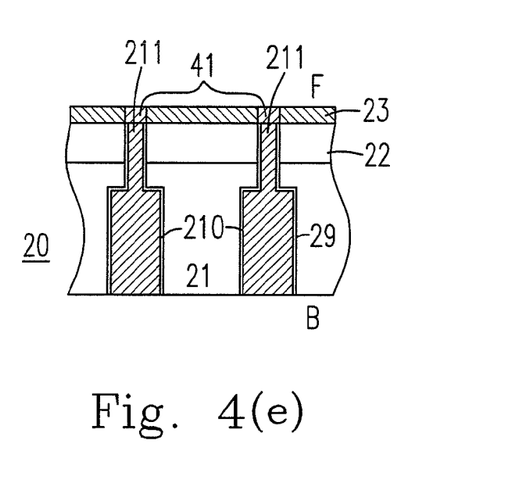
Figure 4F:
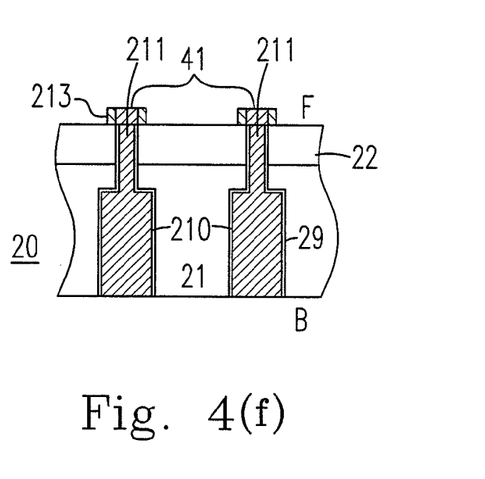

Please continuously refer to FIG. 4(e), next, a part of the silicon material or the silicon substrate in the element layer 21 (i.e. the back side B of the wafer 20) is removed by CMP or other polishing processes until revealing the conductive material 211 in the channel 29. As shown in FIG. 4(e), the channel 29 has passed through the wafer 20 to be the TSV, and the conductive material 211 filled in the channel 29 forms the conductive through connection of the present invention. Please continuously refer to FIG. 4(f), the metal layer 23 then is exposed, developed and etched to form the bond pad 213.

In FIGS. 5(a) to 5(g), the fourth preferred embodiment for the forming method of the conductive through connection in the present invention is illustrated as follows.

Figure 5A:
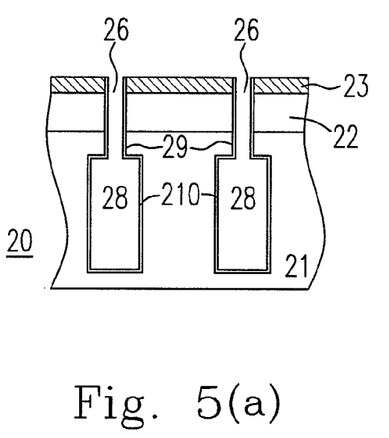
FIGS. 5(a) to 5(g) illustrate the diagrams showing the method for forming conductive through connection in accordance with a fourth preferred embodiment of the present invention.

Please refer to FIG. 5(a) which follows the step in FIG. 2(h), the second dielectric layer 210 is formed on the surface of the first and the second grooves 26, 28. In this preferred embodiment, PVD, CVD, ALD or other deposition processes can be selected. As shown in FIG. 5(a), an oxide layer or other dielectric material is deposited on the first and the second grooves 26, 28 in the element layer 21 portion to be the second dielectric layer 210.

Figure 5B:
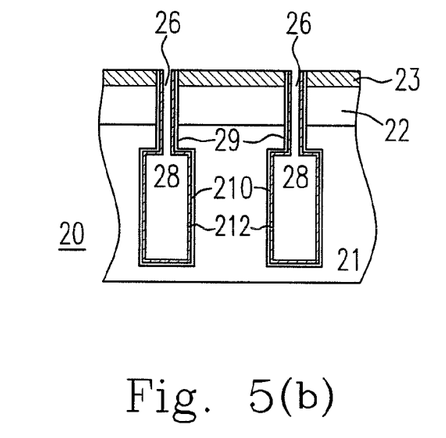

Please continuously refer to FIG. 5(b), since the conductive material 211 filled in the channel 29 is not only limited in tungsten, poly-silicon, and so on, but copper also can be filled therein. However, the copper seed layer 212 must be formed on the channel 29 at first. As shown in FIG. 5(b), the seed layer 212 is deposited on the surface of the second dielectric layer 210. In this preferred embodiment, TaN or TiN is selected to deposit on the surface of the channel 29 to be the seed layer 212.

Figure 5C:
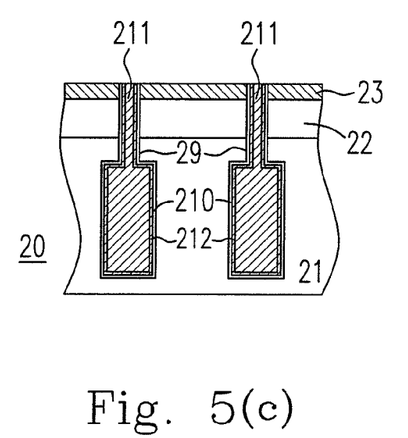

Please continuously refer to FIG. 5(c), the seed layer 212 of the channel 29 is coated with the conductive material 211 (i.e. Cu) for one or more times by PVD, CVD or other etching processes.

Figure 5D:
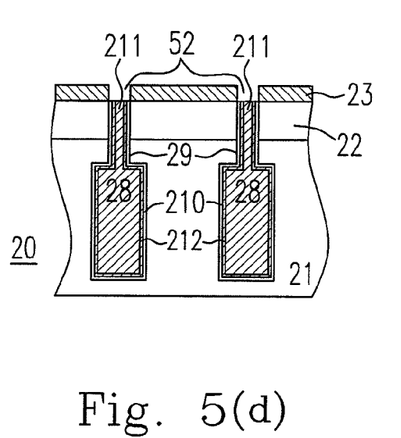

Please continuously refer to FIG. 5(d), since the conductive material 211 and the metal layer 23 are separated by a second dielectric layer 210, the conductive material 211 cannot be electrically connected to the metal layer 23. Therefore, the conductive material 211 and the second dielectric layer 210 in the metal layer 23 must be removed by back-etching to form a groove 52. As shown in FIG. 5(d), anisotrophic etching can be selected in the back-etching in this preferred embodiment.

Figure 5E:
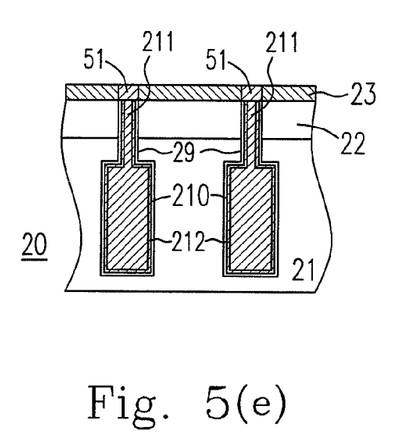

Please continuously refer to FIG. 5(e), the groove 52 is refilled with metal so that the conductive material 211 can be electrically connected to the metal layer 23. PVD, CVP or other deposition processes can be selected in back-filling in this preferred embodiment, and tungsten or Al—Cu can be deposited in the groove 52 to form the back-filling 51. The conductive material 211 can be electrically connected to the metal layer 23 by the back-filling 51.

Figure 5F:
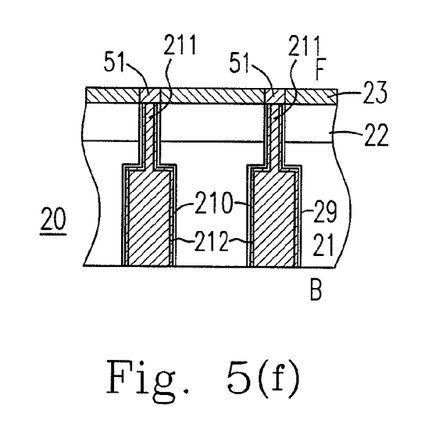
Figure 5G:
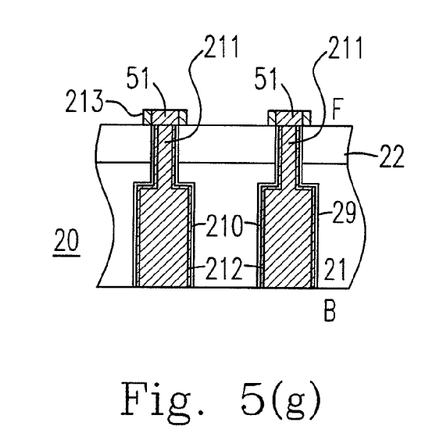

Please continuously refer to FIG. 5(f), next, a part of the silicon material or the silicon substrate in the element layer 21 (i.e. the back side B of the wafer 20) is removed by CMP or other polishing processes until revealing the conductive material 211 in the channel 29. As shown in FIG. 5(f), the channel 29 has passed through the wafer 20 to be the TSV, and the conductive material 211 filled in the channel 29 forms the conductive through connection of the present invention. Please continuously refer to FIG. 5(g), the metal layer 23 then is exposed, developed and etched to form the bond pad 213.

Figure 6:
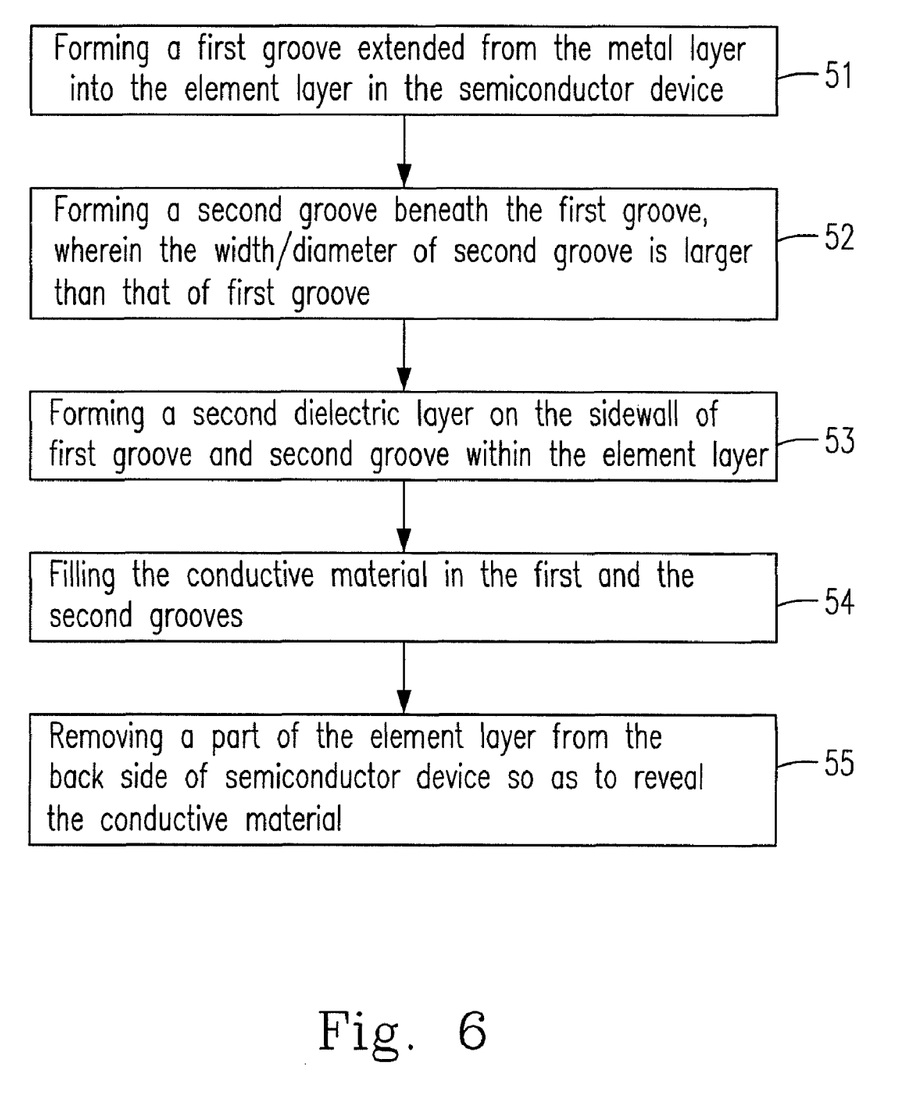
FIG. 6 illustrates the flowchart showing the method for forming conductive through connection in the present invention.

The above-mentioned methods for forming the conductive through connection of the present invention and the specific implementation flowchart are referred to FIG. 6. In FIG. 6, the steps include: (step 51) forming a first groove extended from the metal layer into the element layer in the semiconductor device; (step 52) forming the second groove connected beneath the first groove, wherein the width/diameter of the second groove is larger than that of the first groove; (step 53) forming the second dielectric layer on the sidewall of the first and the second grooves within the element layer portion; (step 54) filling the conductive material in the first and the second grooves; and (step 55) removing a part of the element layer from the back side of the semiconductor device to reveal the conductive material.

The above-mentioned method is implemented in the semiconductor device, such as wafer, chip and die, etc., to form a structure of conductive through connection, which is directly passed through the semiconductor device. The width/diameter of one end of the conductive through connection is larger than that of another end of the conductive through connection, and the shape of the conductive through connection is similar as a bottle shape. This structure of the conductive through connection can be used to stack the semiconductor devices to fabricate the three-dimensional stacking semiconductor device.

The structure of the conductive through connection formed in the first preferred embodiment is the example to illustrate how to use the conductive through connection of the present invention to stack the semiconductor device.

Figure 7:
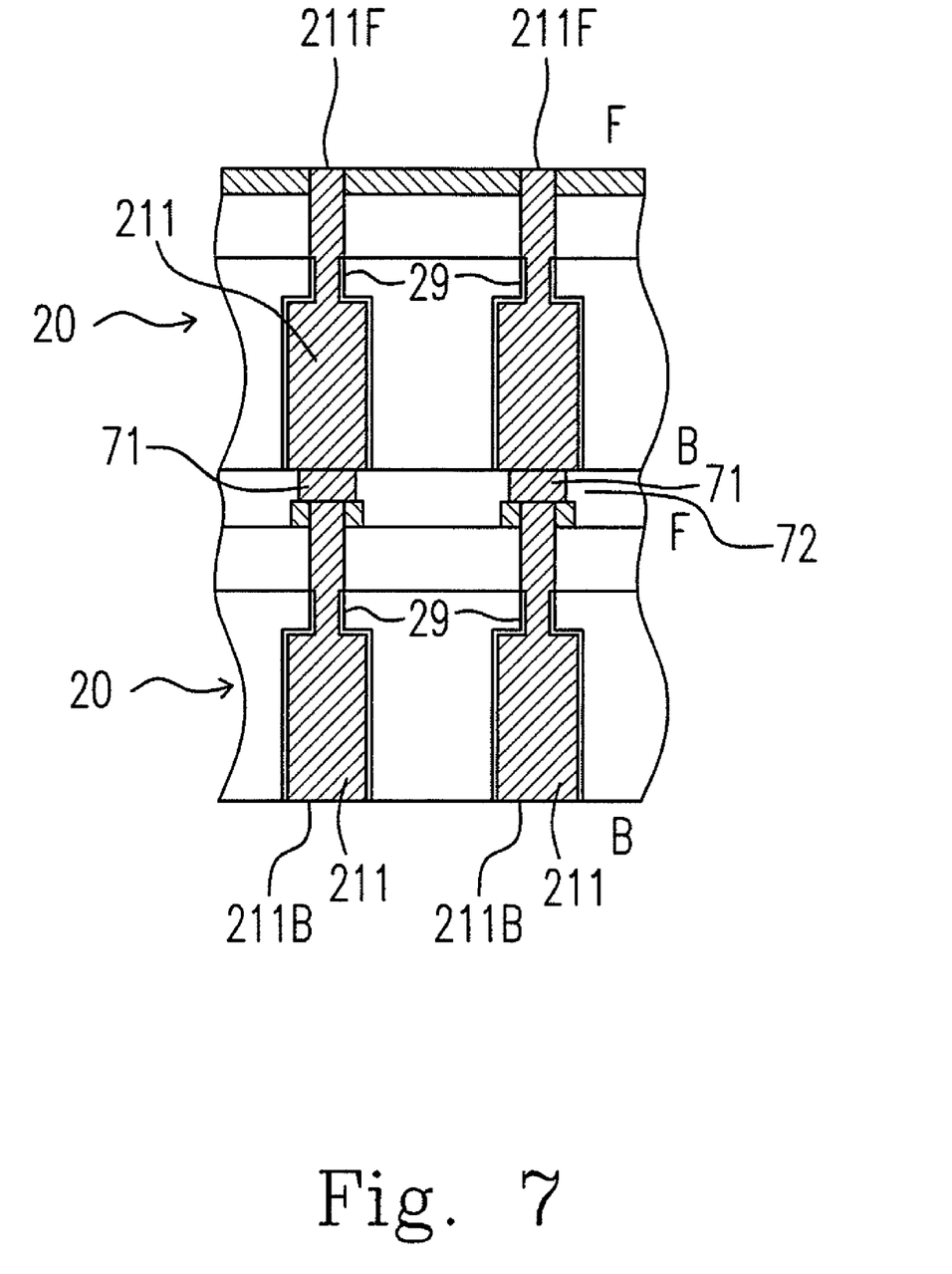
FIG. 7 illustrate the diagram showing the chip stacking pattern of the conductive through connection in accordance with a fifth preferred embodiment of the present invention.

In FIG. 7, the fifth preferred embodiment for the stacking structure of the semiconductor device with the conductive through connection of the present invention is illustrated as follows. Please refer to FIG. 7, each of a plurality of wafers 20 has a front side F and a back side B, and the conductive through connection 211 is passed through the front side F and the back side B of each wafer 20. The revealed portion on the front side F is the support end 211F of the conductive through connection 211, whereas the reveal portion on the back side B is the contact end 211B thereof. The plurality of wafers 20 are aligned with each other based on the conductive through connections 211 of each wafer 20, then the support end 211F and the contact end 211B of the conductive through connections 211 are adhered with each other by the metal glue 71. Next, an interposer layer 72 is formed within two wafers 20 so as to accomplish the stacking of three-dimensional chip.

Figure 8:
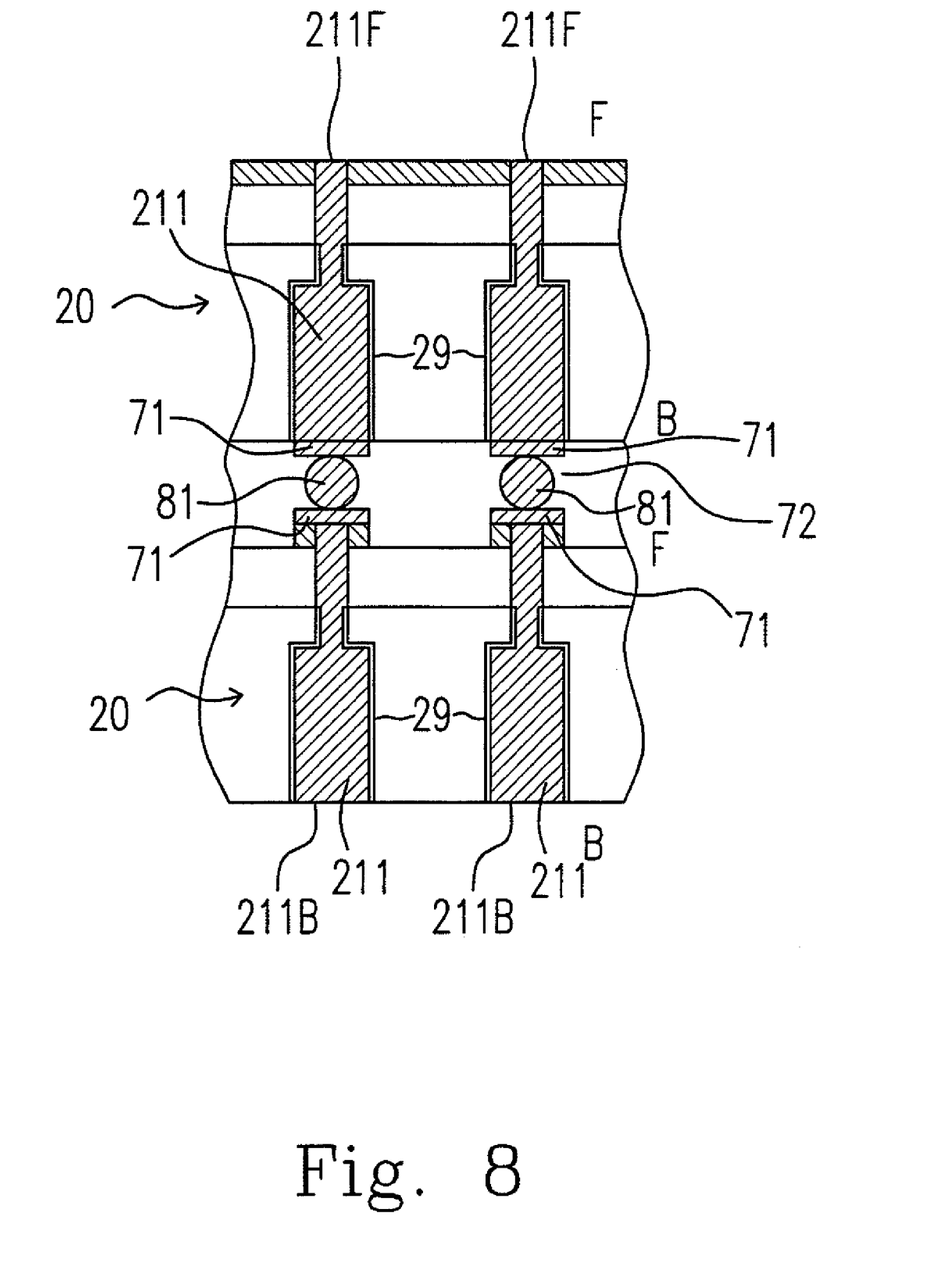
FIG. 8 illustrate the diagram showing the chip stacking pattern of the conductive through connection in accordance with a sixth preferred embodiment of the present invention.

The sixth preferred embodiment for the stacking structure of the semiconductor device with the conductive through connection of the present invention is illustrated in FIG. 8. Please refer to FIG. 8, each of a plurality of wafers 20 has a front side F and a back side B, and the plurality of wafers 20 are aligned with each other based on the conductive through connection 211 of each wafer 20. Afterward, the plurality of wafers 20 are vertically stacked with each other by the back-to-front pattern. The contact portion 81 is disposed between the wafers 20, and the contact portion 81 can be a tin (Sn) ball or other conductors. In the third and the fourth preferred embodiments of the present invention, the back-fillings 41 and 51 can be Al—Cu alloy which has excellent connection effect with tin. The support end 211F and the contact end 211B of the conductive through connections are adhered with the Sn ball by the metal glue 71, then the interposer layer 72 is formed within the wafers 20 so as to accomplish the stacking of the three-dimensional chip. The above-mentioned stacking pattern can be implemented by vertically stacking the plurality of wafers according to the chip design so as to form a stacked semiconductor chip.

From the description on the chip stacking pattern in FIGS. 7 and 8, it can be found that the conductive through connection 211 is manufactured by forming a through silicon via 29 (i.e. channel) having the bottle-neck shape or the bottle shape and by filling the channel 29 with the conductive material simultaneously. The depth and width/diameter of the channel 29 respectively are usually ranged between 5 and 10 μm and smaller than 0.5 μm. When the back-to-front stacking pattern is selected in the wafer 20, the larger alignment error can be tolerated since the width/diameter of the support end 211F on the front side of the conductive through connection is smaller than that of the contact end 211B on the back side thereof. It means that the probable alignment error between the wafers 20 can be reduced by the contact end 211B of the conductive through connection, so that the problem for difficult to precise alignment can be overcome at stacking the microchips, in particularly, at stacking the nanochips. It is worthy to note that the implementation of the present invention can be applied in stacking the wafers or dice. Although the chip is illustrated in the preferred embodiments of the present invention, the implementation of the present invention is not limited in stacking the chips.

It is worthy to note that the above-mentioned stacking pattern is not only limited in the stacking of wafer 20-to-wafer 20, but also includes the stacking such as wafer-to-chip, chip-to-die, chip-to-chip, chip-to-die, die-to-die, and so on. Further, the above-mentioned stacking pattern is not also limited in two layers, a plurality of layers can be stacked. It also means the above-mentioned stacking patterns can be the patterns selected from the group consisting of a plurality of wafers, a plurality of chips, a plurality of dice and the combination thereof.

Furthermore, taking chips as an example, the conductive through connection of the present invention can be disposed in the adequate positions on the chip, and the amount of the conductive through connection is unlimited. Alternatively, TSV is selected to pass through the bond pad on the surface of chip so as to penetrate the chip, then the conductive through connection is formed in the TSV. This conductive through connection then is electrically connected to the bond pad. A plurality of bond pads are usually disposed on the chip; however, it need not to dispose one conductive through connection beneath each bond pad in practice. The engineers are able to decide the amount of the conductive through connections on each chip according to the exact situation or depending on the stacking pattern of chip.

While the invention has been described in terms of what is presently considered to be the most practical and preferred Embodiments, it is to be understood that the invention needs not be limited to the disclosed Embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for forming a conductive connection in a semiconductor device comprising an element layer and a metal layer, and the method comprising steps of:
    (a) forming a first groove extended from the metal layer into the element layer, wherein the first groove has a first dimension and a first sidewall having a metal layer portion sidewall and an element layer portion sidewall;
    (b) forming a second groove connected beneath the first groove, wherein the second groove has a second dimension and a second sidewall, and the second dimension is larger than the first dimension;
    (c) forming a dielectric layer on the element layer portion sidewall and the second sidewall;
    (d) filling the first groove and the second groove with a conductive material; and
    (e) removing a part of the element layer to reveal the conductive material.

2. The method according to claim 1, wherein each of the first and the second dimensions is one of a width and a diameter, and the step (a) further comprises a step (a0) of forming a photomask layer on the metal layer.

3. The method according to claim 2 further comprising a step (a01) of removing the photomask layer.

4. The method according to claim 1, wherein the step (a) further comprises a step (a1) of forming a protective layer on the first sidewall.

5. The method according to claim 4, wherein the first groove further has a bottom surface, and the step (a1) further comprises a step (a11) of etching the bottom surface by one of a wet etching and a chemical dry etching.

6. The method according to claim 4, wherein the step (b) further comprises a step (b1) of removing the protective layer after the second groove is formed.

7. The method according to claim 4, wherein the protective layer is one of an aluminum oxide layer and an insulating dielectric layer, and the insulating dielectric layer is made of a material being one selected from a group consisting of a silicon oxide, a silicon nitride and a combination thereof.

8. The method according to claim 1, wherein the step (c) further comprises a step (c1) of forming a seed layer on the metal layer portion sidewall and the dielectric layer, and the seed layer is one of a tantalum nitride layer and a titanium nitride layer.

9. The method according to claim 1, wherein the first groove is formed by an anisotrophic etching, and the second groove is formed by an isotrophic etching.

10. The method according to claim 1, wherein the step (d) is performed by a treatment being one selected from a group consisting of a physical vapor deposition, a chemical vapor deposition and an electroplating.

11. The method according to claim 1, wherein the step (d) further comprises the steps of:
    (d1) removing a part of the conductive material to form a third groove; and
    (d2) filling the third groove with a second conductive material,
    wherein the second conductive material is one of a tungsten and an alloy having an aluminum-copper.

12. The method according to claim 11, wherein the step (d2) further comprises a step (d3) of removing the metal layer to form a bond pad, and the step (d3) is performed by a plurality of steps of an exposing step, a developing step and an etching step.

13. The method according to claim 1, wherein the step (e) is performed by a polishing process comprising a chemical mechanical planarization, and the conductive material is one selected from a group consisting of a tungsten, a poly-silicon and a copper.

14. The method according to claim 1, wherein the semiconductor device further comprises a second dielectric layer stacked between the element layer and the metal layer, the second dielectric layer and the element layer are fabricated as a body layer, and the conductive connection is a conductive through connection.

15. The method according to claim 1, wherein the metal layer is one of a bond pad and a metal circuit.

16. A method for forming a conductive connection in a semiconductor device having a body layer and a metal layer, and the method comprising steps of:
    (a) forming a space in the semiconductor device; and
    (b) filling the space with a conductive material to form two ends in the semiconductor device, wherein the two ends has dimensions different from each other.

17. The method according to claim 16, wherein the semiconductor device has a body layer and a metal layer, the space passes through the body layer and the metal layer and has a peripheral sidewall having a body layer portion and a metal layer portion, the two ends respectively locate in the body layer and the metal layer, the conductive connection is a conductive through connection, and the method further comprises a step (a1) of forming a dielectric layer on the body layer portion of the peripheral sidewall.

* * * * *